United States Patent [19]
Vikinski

[11] Patent Number: 6,150,862
[45] Date of Patent: Nov. 21, 2000

[54] STABLE DELAY BUFFER

[75] Inventor: Omer Vikinski, Ashdod, Israel

[73] Assignee: Intel Corporation, Santa Clara, Calif.

[21] Appl. No.: 09/173,701

[22] Filed: Oct. 15, 1998

[51] Int. Cl.[7] ................................................. H03H 11/26
[52] U.S. Cl. ......................... 327/262; 327/276; 327/281
[58] Field of Search ..................................... 327/158, 261, 327/363, 270, 262, 276, 281

[56] References Cited

U.S. PATENT DOCUMENTS 5,650,740  7/1997  Lee .......................................... 327/262
5,793,238  8/1998  Baker ...................................... 327/262

FOREIGN PATENT DOCUMENTS 406188699  7/1994  Japan ..................................... 327/263

*Primary Examiner*—Tuan T. Lam
*Assistant Examiner*—Hiep Nguyen
*Attorney, Agent, or Firm*—Blakely, Sokoloff, Taylor & Zafman LLP

[57] ABSTRACT

An apparatus that includes a driver circuit and an active load circuit coupled to an output of the driver circuit. The active load circuit is configured to actively adjust the slew rate of a signal outputted by the driver circuit.

11 Claims, 10 Drawing Sheets

STABLE DELAY BUFFER

FIELD OF THE INVENTION

The present invention relates to the field of integrated circuit design. More specifically to the field of semiconductor circuit design.

BACKGROUND OF THE INVENTION

By their nature, logic circuit designs are timing dependent. Therein, most signals within a logic design must be synchronized with each other. However, there are instances where signals intended to be synchronized are not. For example, between two logic signals, one may be processed through a logic circuit faster than the other, and thereby the signals become non-synchronized. When this occurs, the faster of the two signals is typically time delayed so as to synchronize it with the other signal. One synchronization mechanism for implementing a time delay is known as a time delay buffer.

On a fundamental level, a timing delay buffer can be thought of as adding a predetermined amount of time delay to a circuit. In practice, a time delay buffer is generally inserted into a signal path so as to intercept a signal, add a predetermined amount of time delay to the signal, and then retransmit the time delayed signal onto the signal line. This accomplished, a faster logic signal can be time synchronized with a slower logic signal.

Time delay buffers can be formed from a chain of semiconductor inverters with their inputs and outputs connected in series. FIG. 1 illustrates an example of such a timing delay buffer. A set of inverters 120 are connected in series, such that an input signal at node 105 will appear as a time delayed signal at node 110. In this configuration of a timing delay buffer, the sum total of each inverter's delay time determines the total delay time of the series of inverters.

A common problem encountered in circuit 100 and circuits of similar design, is that an inverter's delay time (i.e. the propagation time) will vary due to fabrication process variations, and due to variations in operating conditions of the die. Therefore, the range of the total delay time, of the series of inverters of FIG. 1, can vary widely as fabrication and operating conditions vary. The greater the number of inverters in a series, the greater the possible variations in total delay time.

Note that performance variations can be due to, for example, (1) semiconductor fabrication process variations, and (2) operating condition variations. Fabrication process variations include variations in, for example, oxide thickness, transistor geometries, internal polysilicon capacitance, n-channel or p-channel capacitance, metal line resistance and capacitance, and the like. Operating condition variations include variations in, for example, power supply voltages, and variations in temperature of the die or circuit during operation. Collectively, variations due to process, voltage and temperature are known as PVT variations, while variation due to voltage and temperature are known as VT variations.

FIG. 2 illustrates another typical time delay buffer circuit 200, that includes a driver 215, capacitive load 220, and load 275. Note that the driven signal from any semiconductor drive circuit, including driver 215 of FIG. 2, will have some inherent slew rate (change in voltage per unit time) due to the nature of the fabrication process and the materials used in the process.

To create a time delayed signal, circuit 200 adds a capacitive load 220 to the output of driver 215 at node 217. Capacitive load 220 decreases the inherent slew rate (and increases the rise time) of a signal on node 217. In turn, the decreased slew rate of the signal at node 217, adds a time delay to the signal at node 210. For example, load 275 has a fixed threshold voltage for a logic "0" or "1" at node 217 for any signal appearing on node 217. Capacitance 220 elongates the rise or fall times of a signal at node 217 such that load 275 will recognize a logic transition at a later point in time then if capacitive load 220 were not present. Therefore, an input signal at node 205 will appear as a time delayed signal at node 210, where the value of the capacitance of capacitive load 220, determines the amount of time delay.

A common problem in circuit 200, and in similar circuits, is that the slew rate of any inverter will vary over PVT variations. Therefore, when delay buffer driver 215 is affected by PVT variations, resulting in an other than nominal slew rate signal from driver 215, the time delay of the circuit is disturbed from a desired nominal time delay. Additionally, circuit 200 generally does not correct this problem because capacitive load 220 (for example, a pMOS and an nMOS capacitor) will also vary in an uncontrolled manner due to PVT variations.

Attempts have been made to compensate circuit 200, and similar circuits, for PVT variations. For example, large channel transistors have been used in an attempt to decrease process variation effects. However, use of large channel transistors only passively compensates for PVT variations, and they also have the disadvantage of using large amounts of die area.

SUMMARY

The present invention concerns a method and apparatus for providing a stable delay. The method and apparatus of the present invention includes a driver circuit and an active load circuit coupled to an output of the driver circuit. The active load circuit is configured to actively adjust the slew rate of a signal outputted by the driver circuit.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
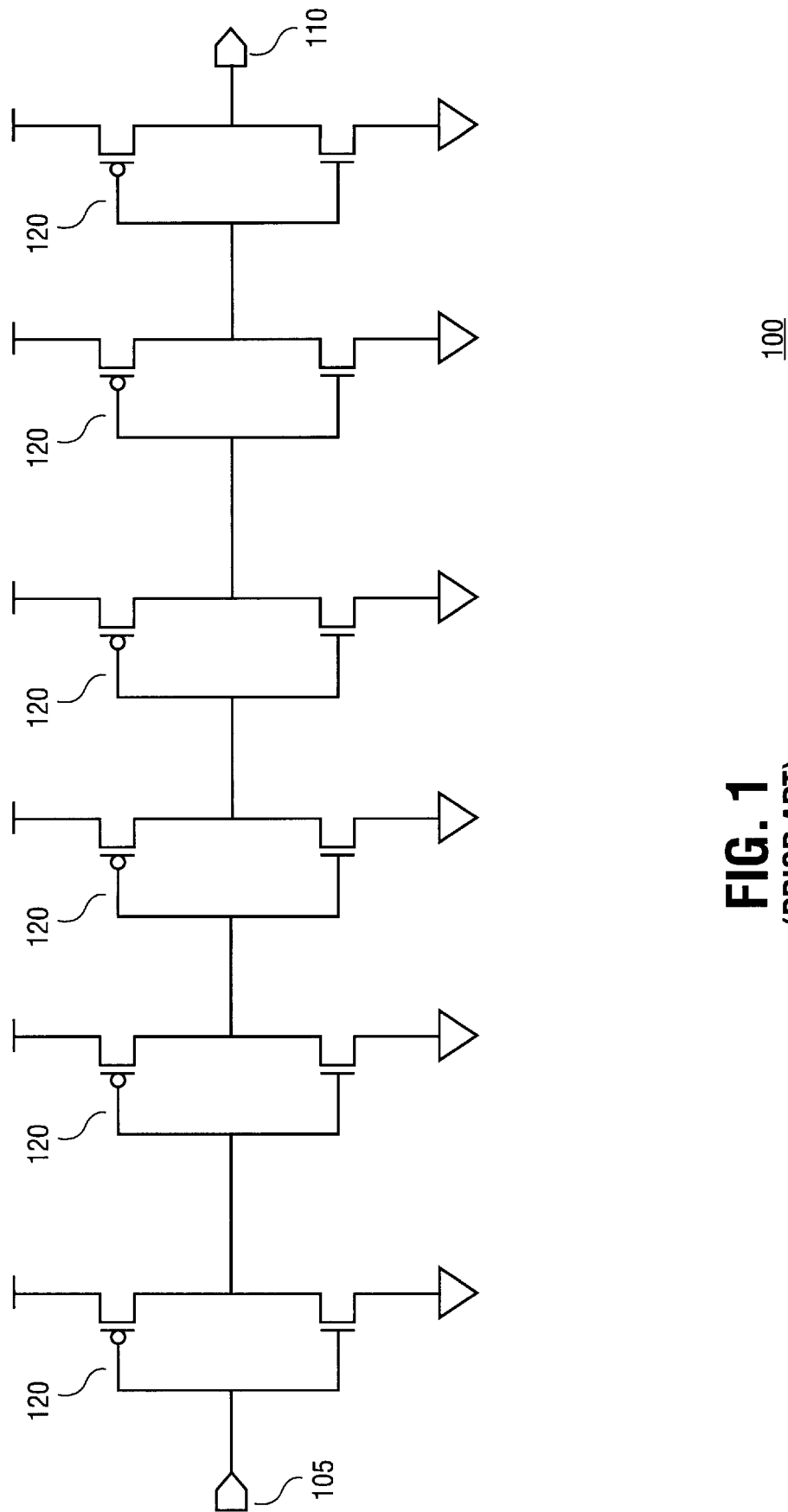
FIG. 1 shows a configuration for a timing delay buffer formed from a series of inverters.

The present invention concerns an apparatus for actively maintaining a stable delay time across a delay buffer circuit. During operation, an active load circuit maintains a stable delay time by controlling the slew rate of the delay buffer's driver output signal. By controlling the slew rate of the delay buffer's driver output signal, the active load circuit controls the delay time across the delay buffer circuit. In the present invention, the combination of an active load circuit connected to a delay buffer driver is known as a stable delay buffer.

In the following description, numerous specific details are set forth such as designs for passgates, capacitors, drivers and loads, etc., in order to provide a through understanding of the present invention. It will be apparent, however, to one of ordinary skill in the art that the present invention may be practiced without these specific details. In other instances, well-known semiconductor processing techniques, components and structures have not been shown in detail in order to avoid obscuring the present invention.

As previously described, a delay buffer purposefully delays to a signal so as to, for example, synchronize the timing of a faster logic block to a slower logic block. However, due to process, voltage and temperature (PVT) variations, a delay buffer driver can output a drive signal with an other than nominal slew rate. In turn, the deviation from a nominal slew rate disturbs the time delay of the delay buffer from some desired nominal time delay.

In the present invention, the active load circuit is typically made up of a self adjusting impedance source connected to a capacitive load. In response to PVT variations, the active load circuit self adjusts its impedance value, which in turn increases or decreases the amount of capacitive load on a signal outputted by the Stable Delay Buffer driver. As the capacitive load on a signal increases or decreases, the slew rate of the signal will decrease or increase, respectively. It follows, by adjusting the slew rate the active load circuit adjusts for variations in the delay time, caused by variations in PVT.

In one embodiment of the present invention, a semiconductor passgate is connected between the output of the delay buffer driver and a capacitive load. In this embodiment, the active load circuit is formed by connecting the passgate to the capacitive load. The passgate, operating in its active region, functions as a self adjusting impedance source between the capacitive load and the delay buffer driver's output. As such, the passgate controls the capacitance on the output of the delay buffer driver.

For example, when PVT conditions decrease the passgate's impedance, capacitance from the capacitive load increases on the delay buffer driver's output. As the capacitive load increases on the delay buffer driver's output, a faster then nominal slew rate signal is slowed and adjusted toward a nominal slew rate. It can be seen that converse effects will occur on the slew rate of the delay buffer driver's output signal, when PVT conditions increase the passgate's impedance.

In the above embodiment, the Stable Delay Buffer adds a self adjusting, stable timing delay to the signal outputted by the delay buffer driver. An advantage of stabilizing a timing delay is apparent as electronics operate at increasing speeds, timing error margins decrease, and timing synchronization between logic circuits becomes increasingly critical. In such a scenario, the need to a select and maintain a stable delay time increases. Therein, an advantage of using a stable delay buffer to stabilize a timing delay is that as PVTs vary causing a maximum and a minimum delay through the stable delay buffer, the ratio of maximum to minimum delay through the stable delay buffer approaches unity.

In an alternative embodiment of the present invention, the Stable Delay Buffer is configured for use as a stable delay clock buffer. The need for this is apparent as electronic operating speeds increase and timing synchronization becomes increasingly critical, the delays created by delay buffers must be more stable over changes in PVT. In this embodiment, the capacitance value of the active load circuit is sized to stabilize the slew rate of a clock signal about the clock's nominal frequency, over PVT variations. By stabilizing the slew rate of a clock signal, both its duty cycle and its duration at logic "1" and "0" voltage levels is stabilized. Therefore, a stable delay clock buffer maximizes a clock's durations while minimizing timing error margins. Therein, an advantage of using a stable delay buffer as a stable delay clock buffer, is that as PVTs vary, the ratio of maximum to minimum rise times through the stable delay buffer, and the ratio of maximum to minimum fall times, approaches unity.

In yet another embodiment, the active load circuit utilizes dual passgates connected in parallel between the stable buffer driver's output and the capacitive load. The passgates are controlled such that the impedance across the passgates is always equal or nearly equal.

Figure 3:
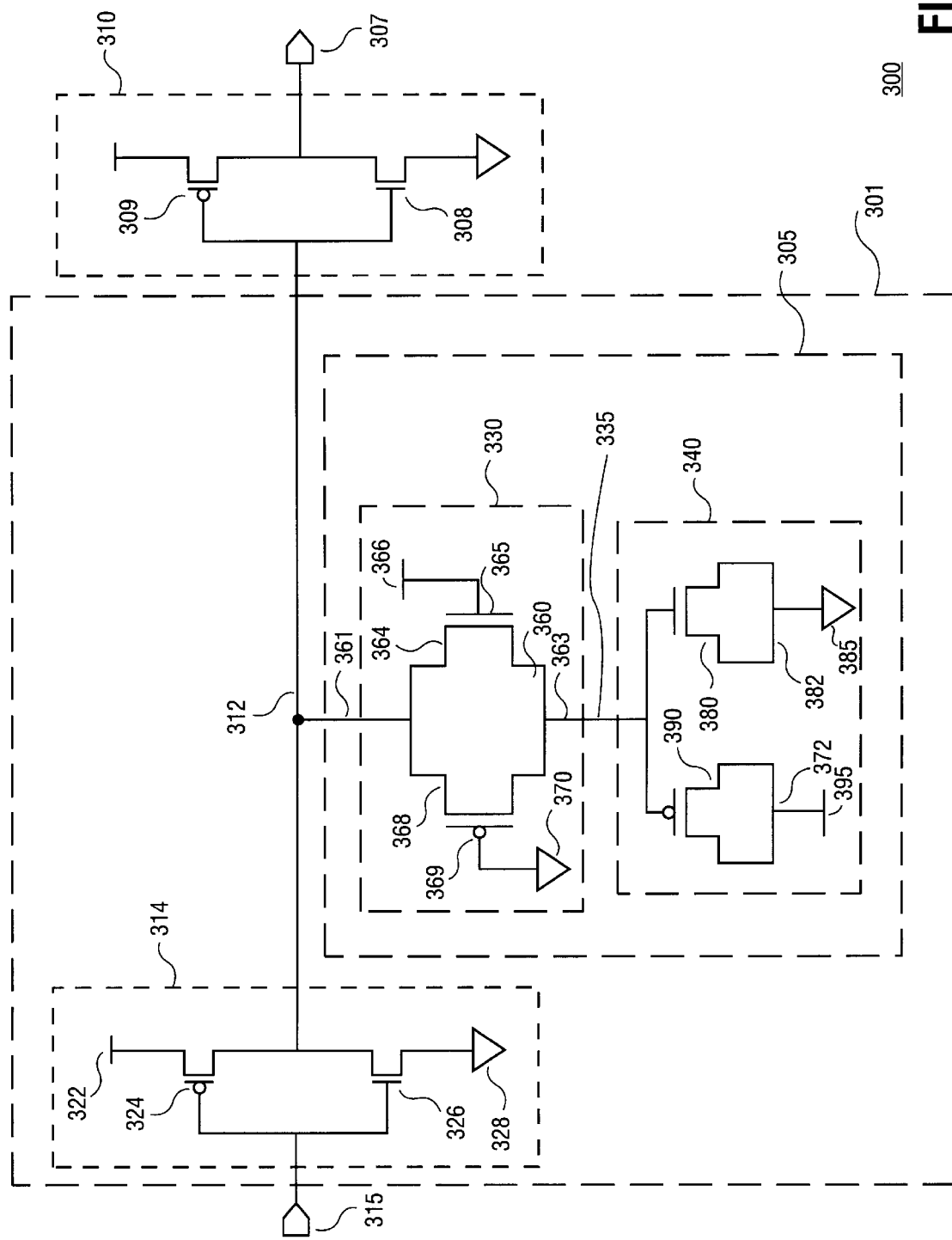
FIG. 3 illustrates an embodiment of a stable delay buffer using a passgate as an impedance source.

FIG. 3 show circuit 300 which includes load 310 and stable delay buffer 301. Stable delay buffer 301 includes active load circuit 305 and a stable delay buffer driver 314. As discussed in the embodiments above, stable delay buffer 301 can be used, for example, to either stabilize the delay time of a non-periodic signal, or to stabilize the delay of a clock signal (i.e. a periodic signal) across stable delay buffer 301.

In operation, stable delay buffer 301 may, but does not necessarily have to, invert the polarity of a signal received at node 315. Also, load 310 may, but does not necessarily have to, invert the polarity of a signal received at node 312. Therefore, the polarity of an output signal at node 307 and the polarity of an input signal at node 315, may be the same or complementary.

Additionally, note that driver 314, load 310 and active load circuit 305 of FIG. 3 are shown as CMOS technology for example purposes only. They may be manufactured from different process technologies such as bipolar, BiCMOS, and the like. The only requirement is that the driver 314, load 310 and active load circuit 305 are compatible with each other during operation. Also, typical of the embodiments of the present invention, driver 314, active load circuit 305 and load 310 are fabricated on one integrated circuit substrate.

As shown in circuit 300, driver 314 is a CMOS inverter which includes a pMOS transistor 324 connected between a first voltage source (Vdd) 322, and an nMOS transistor 326. In turn, nMOS transistor 326 is connected between pMOS transistor 324 and a second voltage source (Vss) 328. While driver 314 is shown as a CMOS inverter, it can be any inverting or non-inverting driver circuit which is compatible with the active load circuit 305. Additionally, as shown load 310 is also a CMOS inverter, however it can be any inverting or non-inverting load that is compatible with the active load circuit 305.

Active load circuit 305 is coupled to node 312 and includes a passgate block (or impedence source) 330 and a capacitive load 340. Passgate block 330 has one terminal 361 coupled in node 312 and a second terminal 363 coupled to capacitive node 335 of capacative load 340. Passgate block 330 includes nMOS transistor 364 having one source/drain region coupled to terminal 361 and the other source/drain region coupled to capacative node 335 and its gate electrode 365 coupled to Vdd 366. Passgate block 330 also includes a pMOS transistor 368 having one source/drain region coupled to terminal 361 and the other source/drain region coupled to capacative node 335 and its gate electrode 369 coupled to Vss 370. nMOS transistor 364 and pMOS transistor 368 are coupled in parallel between node 312 and capacative node 335.

Capacitive load 340 includes two capacitors, passive nMOS capacitor 380 and passive pMOS capacitor 390 each coupled to a common capacitive node 335. pMOS capacitor 390 can be a pMOS transistor having its gate electrode coupled to common capacitive node 335 and having of its source/drain regions coupled 392 to Vdd 395. NMOS capacitor 380 can be a nMOS transistor having its gate electrode coupled to capacitive node 335 and having its source/drain regions coupled 382 to Vss 385. Capacative node 335 couples the gate of pMOS capacitor 390 and nMOS capacitor 380 to one end of 363 passgate 330.

Figure 4:
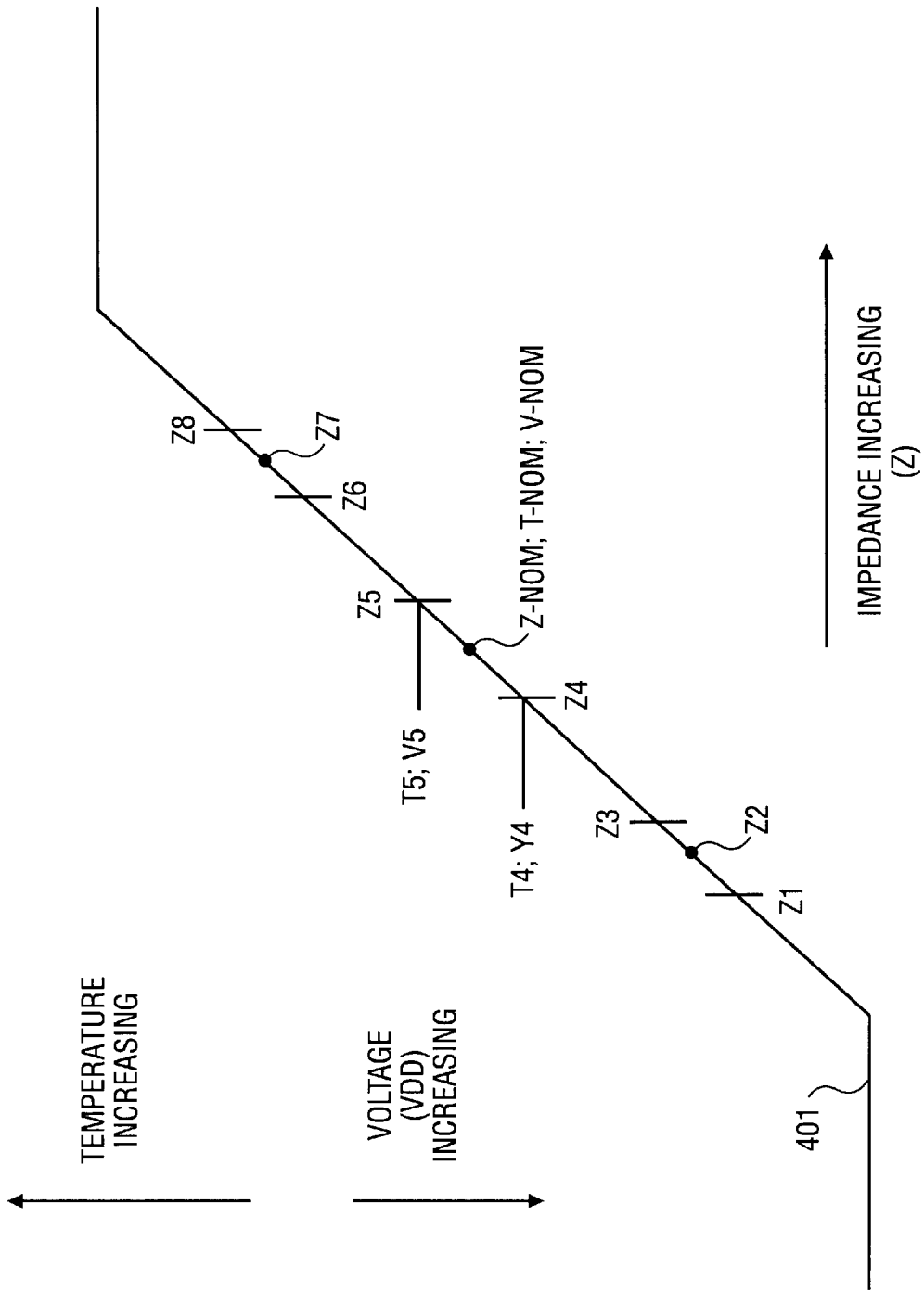
FIG. 4 shows an example of an impedance curve illustrating a nominal impedance point and variations from that point.

The passgate block 330 may be designed to have a default impedance Z-nom of FIG. 4, that corresponds to nominal voltage and temperature operating conditions (e.g. V-nom and T-nom of FIG. 4). During fabrication of impedance source 330, the nominal impedance (i.e. Z-nom) and the slope of the impedance curve are set. However, when stable delay buffer 301 is operating within an intended nominal range, the impedance of the impedance source will tend to vary along its slope within some nominal VT range, as shown by Z5 and Z4 of FIG. 4.

Figure 5:
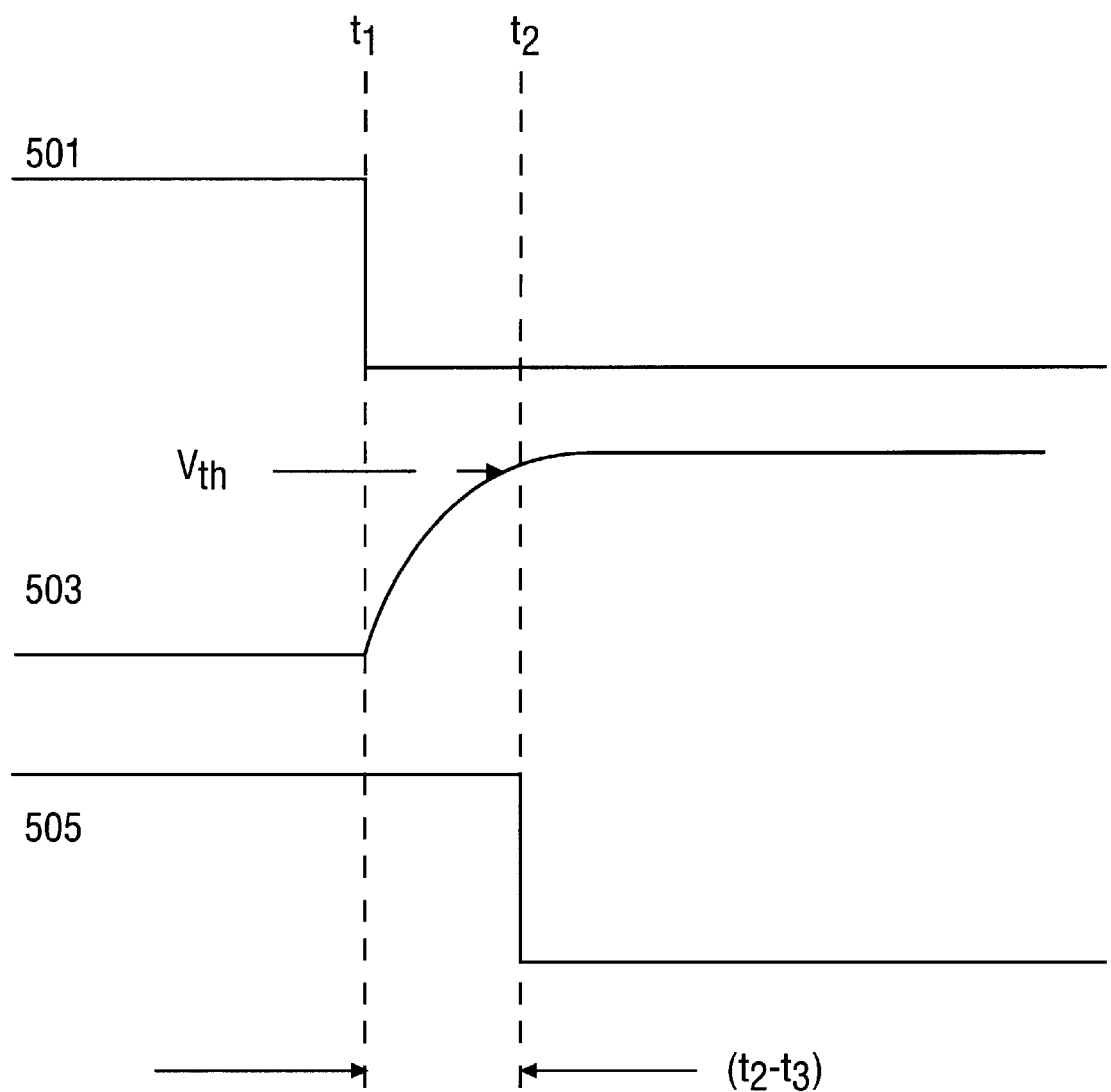
FIG. 5 illustrates one embodiment of waveforms of a nominal time delay created in a stable delay buffer.
Figure 6:
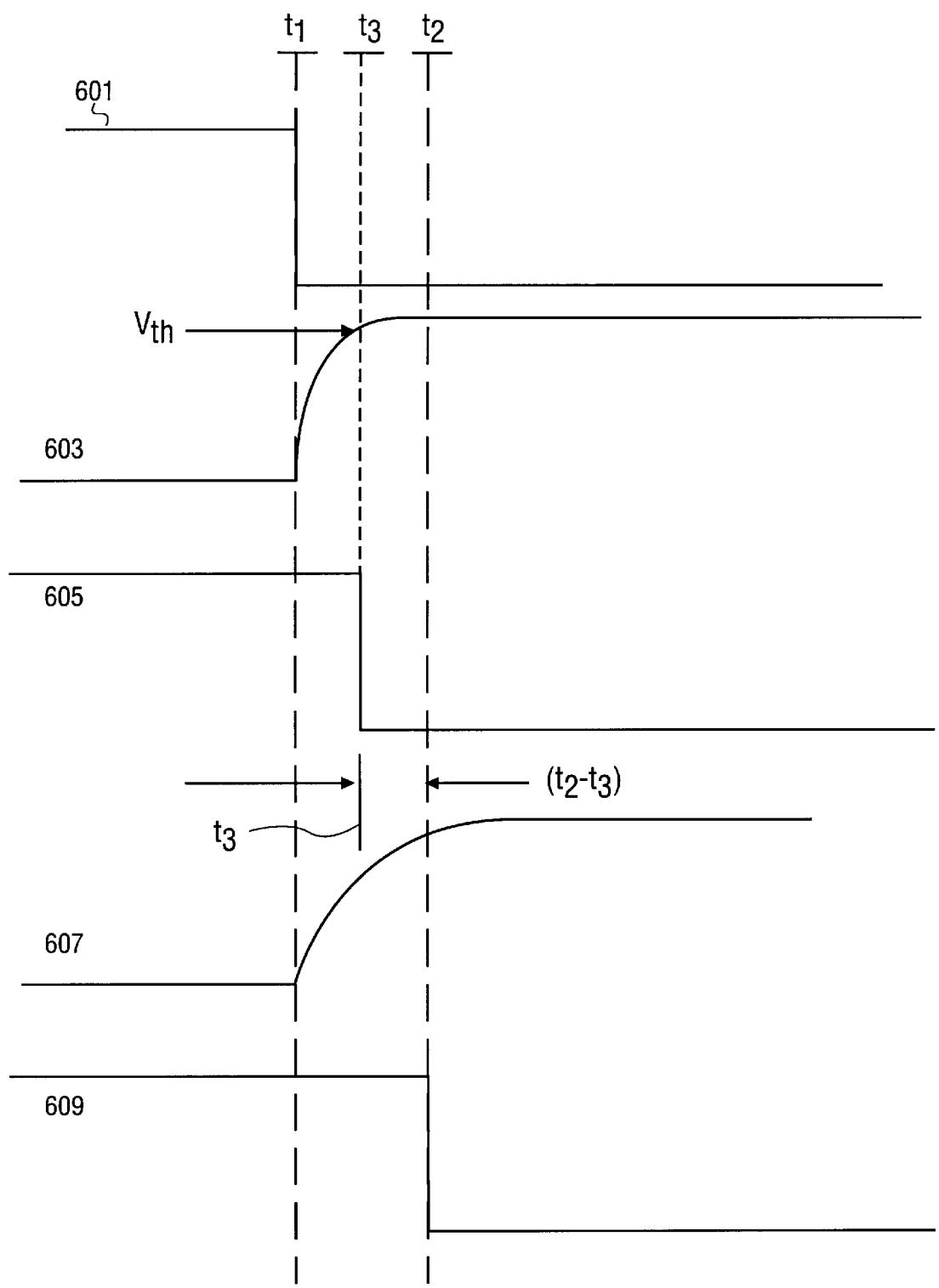
FIG. 6 illustrates one embodiment of waveforms of a smaller-than-nominal timing delay being adjusted towards a nominal, as Vdd is increased above nominal.
Figure 7:
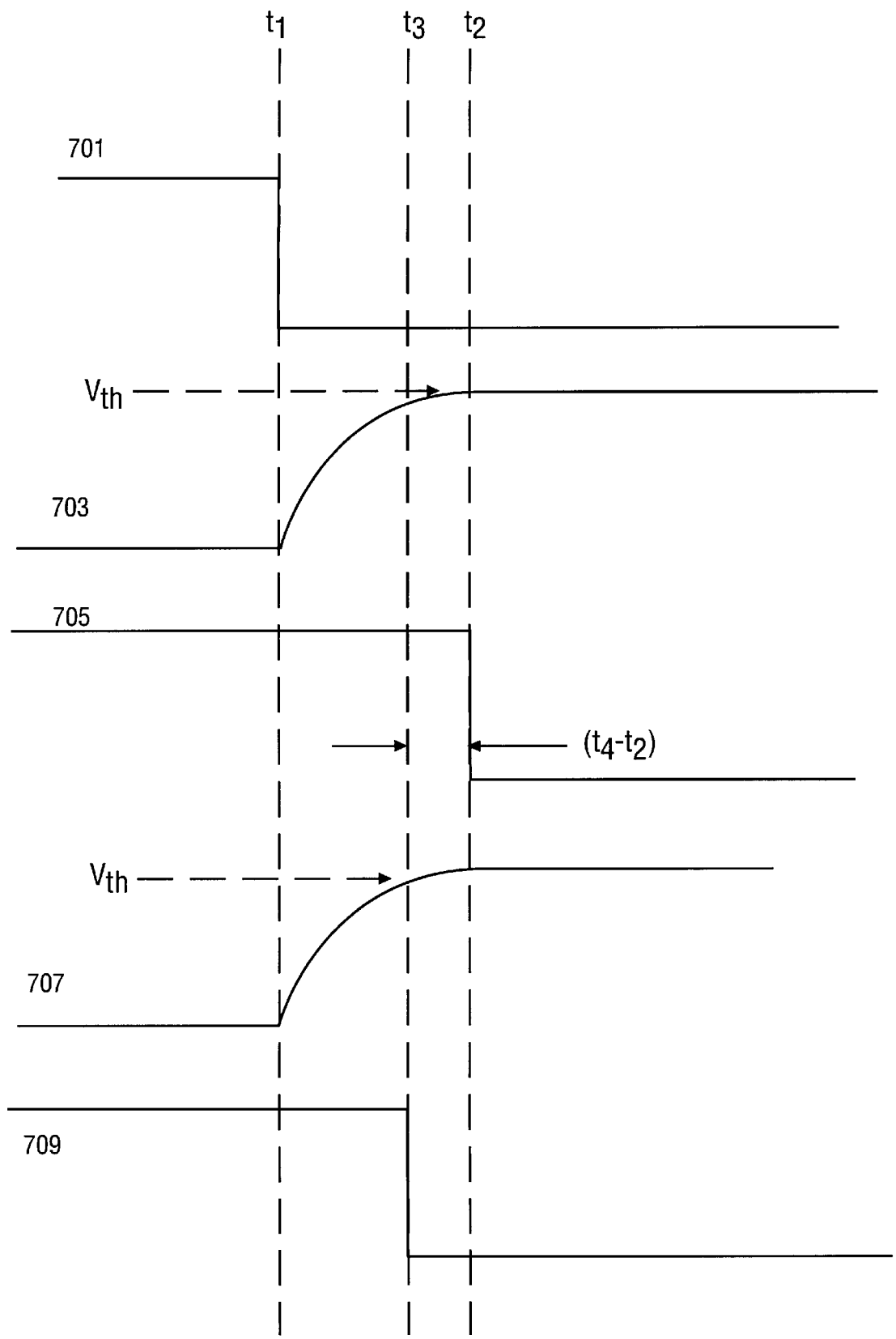
FIG. 7 illustrates one embodiment of waveforms of a larger-than-nominal timing delay being adjusted towards nominal, as the operating temperature is increased above nominal.

FIG. 4 also shows a range of other impedances, for example Z1 through Z8. These impedances correspond to changes in the impedance of impedance source 330 as PVT conditions vary. The effects of varying PVT conditions will be discussed in more detail with respect to FIGS. 5–7. In brevity, FIG. 5 illustrates example waveforms of circuit 300 when it is operating during nominal PVT conditions. FIG. 6 shows example waveforms of circuit 300 when its operating voltage (Vdd) increases above a nominal operating voltage. FIG. 7 shows example waveforms of circuit 300 when its operating temperature increases above a nominal operating temperature.

Two points of interests arise in examining the impedance slope of FIG. 4. First, the slope for the impedance as a function of voltage (e.g. Z5–Z4/V5–V4 of FIG. 4), is not necessary the same slope as the impedance as a function of temperature (e.g. Z5–Z4/T5–T4 of FIG. 4). At the time of fabrication, the fabrication process will inherently determine the impedance as a function of voltage and temperature changes. Second, depending upon the design of impedance source 330, the shape of the impedance curve could be some non-linear function.

In one embodiment, circuit 300 is used as a stable delay buffer for non-periodic signals. When used in this embodiment, a non-periodic signal shown as a falling edge signal 501 of FIG. 5, is received at node 315 of FIG. 3.

During nominal operation, in response to signal 501, a nominal slew rate will occur on node 312, as shown by signal 503. When signal 503 of FIG. 5 reaches threshold voltage (i.e. the 1 to 0 threshold of load 310), a nominal time delayed rising edge signal 505 will occur at node 307. Note the nominal time delay equals t2–t1 (t2 minus t1) of FIG. 5. (Note: Vth of FIGS. 5, 6 and 7 are equal; signals 501, 601 and 701 are equal; and times t1 and t2 are the same respectively in FIGS. 5, 6 and 7.)

An important characteristic of stable delay buffer 301 is its ability to adjust for changes from nominal Vdd and Vss operating voltages. The ability of stable delay buffer 301 to adjust for an increase in Vdd operating voltage is illustrated in FIG. 6. Signal 603 represents the voltage at node 312 over time when a signal 601 is applied to node 315 of a circuit 300 without active load 305 and when Vdd is increased above nominal. Signal 605 represents the voltage at node 307 overtime when signal 601 is applied to node 315 of a circuit 300 without active load circuit 305 and when Vdd is increased from nominal. In comparision, signal 607 represents the voltage at node 312 when signal 601 is applied to node 315 of circuit 300 including active load 305 and when Vdd is increased from nominal. Signal 609 is represents the voltage at node 307 over time when signal 601 is applied to node 315 of circuit 300 including active load circuit 305 and when Vdd is above nominal.

As Vdd increases, the slew rate of driver 314 will increase above a nominally designed slew rate (i.e., a faster signal than nominally designed for). In response to signal 601, and without adjustment by active load circuit 305, Vth would be reached at time t3 of FIG. 6, as shown by signal 603 (where t3 of FIG. 6 is an earlier time than t2). In this example, the nominal delay of signal at node 307 (without active load circuit 305) would be decreased by t2–t3 (t2–t3), as shown by signal 605.

However, during operation active load circuit 305 is functioning and as a result as Vdd increases, the impedance of impedance source 330 will decrease from Z-nom to Z2 (both of FIG. 4), for example. Also, the impedance of active load circuit 305 will tend to vary within a range of Z3 to Z1 when adjusting for an increased Vdd.

As the impedance decreases, the capacitance from capacitive load 340 applied to node 312, will increase. As a result, the faster than nominal signal is slowed toward the nominal delay time t2, as shown by signal 607 and signal 609 in FIG. 6. It can be seen that the converse adjustments to the slew rate of a signal on node 312 will occur as Vdd decreases from nominal. Additionally, similar impedance adjustments will occur as Vss varies from nominal.

Another important characteristic is the ability of stable delay buffer 301 to adjust for changes from a nominal operating temperature. The ability of stable delay buffer 301 to adjust for an increase from a nominal operating temperature is illustrated in FIG. 7. Signal 703 represents the voltage at node 312 over time when a signal 701 is applied to node 315 of a circuit 300 without active load circuit 305 and when the operating temerature is above nominal. Signal 705 represents the voltage at node 307 over time when a signal 701 is applied to node 315 of circuit 300 without active load 305 and when the operating temperature is above nominal. In comparision, signal 707 represents the voltage at node 312 when a signal 701 is applied to node 315 of circuit 300 including active load circuit 305 and when the operating temperature is above nominal. Signal 709 represents the voltage at node 307 over time when a signal 701 is applied to node 315 of circuit 300 including active load circuit 305 and when the operating temperature is above nominal.

For example, as the operating temperature increases from nominal, the slew rate of driver 314 will tend to decrease from nominal (i.e. a slower rise time from nominal) as shown by signal 703. In response to signal 701, and without adjustment by active load circuit 305, the Vth of load 310 would be reached at t4 (where t4 occurs at a time later then t2) and a longer than nominal delay would result, as shown by signal 705.

However, during operation active load circuit 305 is functioning, the impedance of impedance source 330 will increase to Z7, and thereby the capacitance from capacitive load 340 applied to node 312, will decrease. Also, the impedance of active load circuit 305 will tend to vary within a range of Z8 to Z6 when adjusting for an increased operation temperature.

As a result of the a decreased capacitive load at node 312, the slew rate of the signal will increase (i.e. become a faster signal) as shown by signal 707, and the signal will tend toward a nominal slew rate time of t2 as shown by signal 709. It follows that the resultant delay time at node 307, will also tend toward nominal. It can be seen that the converse of the above will occur if the operating temperature were to decrease from nominal.

In one embodiment of a stable delay buffer, the length and width of transistor and capacitor gates are specified to create a nominal delay of 200 picoseconds. The numbers in parentheses following each element represent the length and width, respectively of a transistor or a capacitor gate. For example pMOS 324 (7.52/0.76), represents pMOS transistor element 324 of FIG. 3, with a gate length of 7.52 microns (micron=μm) and a width of 0.76 microns.

For a 200 picosecond delay, the following transistor sizes follow as an example of one embodiment of a stable delay buffer, utilizing CMOS inverters for driver 314 and load 310: For driver 314, pMOS 324 (7.52/0.76) and nMOS 326 (2.2/0.96); For impedance element 330, pMOS 368 (2.08/0.4) and nMOS 364 (2.44/0.4); For capacitive load 340, pMOS capacitor 390 (20/3) and nMOS capacitor 380 (20/3); For load 310, pMOS 309 (11.04/0.4) and nMOS 308 (6.4/0.4); And wherein Vdd=1.8 volts and Vss=ground.

In another embodiment of circuit 300, stable delay buffer 301 functions as stable delay clock buffer and is used to create a stable delay for clock signals (i.e. periodic signals). In this embodiment, the impedance and capacitive load values of stable delay buffer 301 are chosen to operate about a nominal clock signal, for example signal 901 of FIG. 9. However, if the periodicity of the clock is of sufficiently longer duration then the periodicity selected for the nominal design, as is clock signal 821, then capacitive load 340 will fully charge and discharge during each half clock cycle.

Figure 8:
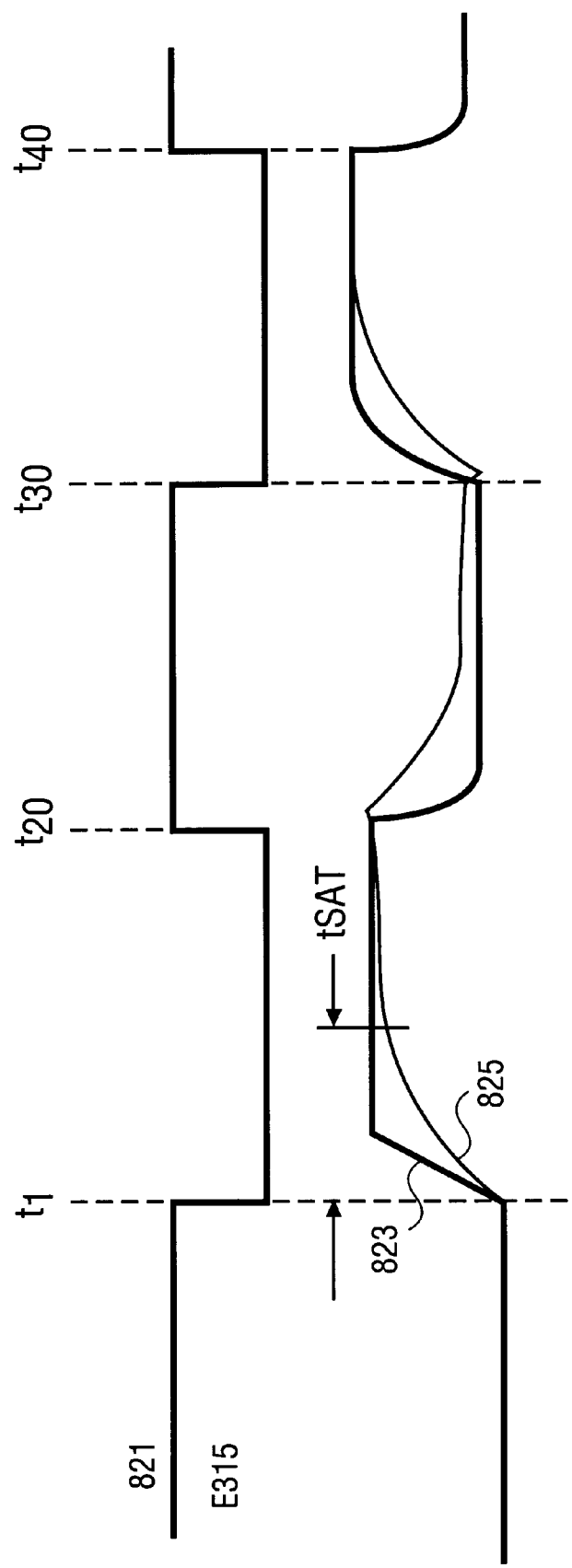
FIG. 8 shows one embodiment of waveforms where a stable delay buffer is used as a clock buffer.

For example, clock signal 821 at node 315 will create, at nominal PVT conditions, a nominal slew rate signal 823 at signal node 312. In response to signal 823, capacitive load 340 at capacitive node 335 will further decrease the slew rate of the signal at node 312, as shown by signal 825. However, because of the long clock periodicity of clock signal 821, at some time period Tsat shown in FIG. 8, signal 825 will reach a fully charged or discharged voltage during each half clock cycle. In this example, stable delay buffer 301 will function as if it is processing non-periodic signals. And as such, the stable delay buffer 301 will compensate for non-nominal slew rates caused by PVT variations, as discussed in the above embodiments of the invention.

Figure 9:
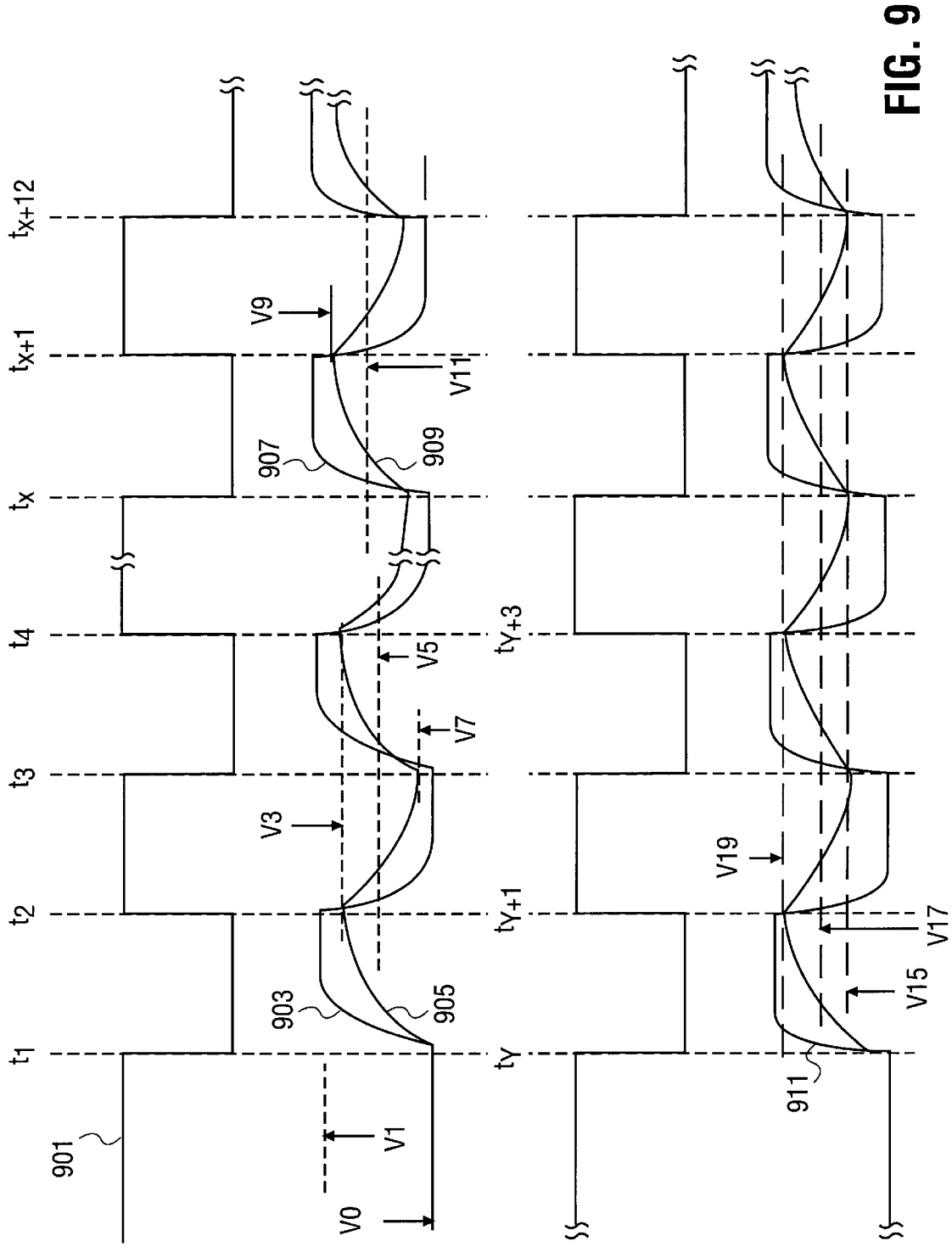
FIG. 9 shows one embodiment of additional waveforms where a stable buffer is used as a clock buffer.

As the frequency of a clock at node 315 increases towards a nominal clock frequency, the periodicity of the clock decreases and the stable delay buffer will operate about its nominal design point. Signal 901 of FIG. 9 is an example of a nominal clock frequency. However, while the clock signal at node 315 may be of nominal frequency, the driver 314 may not be of nominal driver strength. For example, fabrication process variations may form driver 314 with of lower than nominal strength driver (a weak driver). In that case, the slew rate of signal 903 at node 312, would decrease (i.e. a longer rise time). Signal 905 at capacitive node 335, will also experiences a decreased slew rate due to the weak driver. As such, capacitive node 335 will not reach a maximum voltage V1, of FIG. 9, but some other lower voltage V3 of FIG. 9. Also, in the initial clock periods, signal 905 will not fully discharge but reach some voltage V7.

As the clock signal continued to some time tx, the capacitive load will not yet fully charge or discharge, but will reach some average RMS voltage V11 of FIG. 9. As this occurred, the voltage delta between the capacitive node 335 and the signal node 312 will decrease from some larger (V1-Vo) delta to some smaller (V1-V11). In turn, as this voltage delta between node 312 and 335 decreased, the effective capacitive load on any signal at node 312 would also decrease.

As the effective capacitive load on node 312 decreases, the slew rate of signal 903 will increase. At some later time tx, signal 903 will reach a midpoint adjustment as shown by signal 907. At time ty, signal 907 reaches a final equilibrium slew rate as shown by signal 911. Also at time ty, the RMS voltage on capacitive load 340, as measured at capacitive node 335, will have stabilized at some voltage V17. Furthermore, the charge and discharge voltage cycles due to the clock will fluctuate about some equal voltage delta, V19 to V15, about RMS voltage V17. Also at time ty, the slew rate of signal 911 will have been increased toward nominal.

Basically, in the above example, a signal with a slew rate that is initially decreased from a nominal slew rate, is allowed to increase toward a nominal slew rate, by reducing the effective capacitance on the signal. The phenomena of a reduced effective capacitance occurs because, as the RMS voltage on capacitive node 335 increases above Vss, the capacitive load 340 becomes partially charged and therefore draws less energy from a clock signal at node 312.

Additionally, it follows that if driver 314 were of stronger than nominal drive strength, because of PVT variations, a signal at capacitive node 335 would attempt to fully charge capacitive load 340 within one-half clock cycle. Since the capacitive load 340 is attempting to fully charge, skew rate correction will not tend to occur because of the effective capacitance effect of the above paragraph. However, the same PVT variations that create a stronger than nominal driver 314, also reduce the impedance of impedance source 330. In turn, the capacitive load on node 312 would be higher than nominal, and the signal on node 312 will tend to be adjusted towards nominal.

In another embodiment of the stable delay clock buffer, the length and width of transistor and capacitor gates are specified for a clock operating at or near 400 MHz. Referring to the element numbers of FIG. 3, the numbers in parentheses below following each element represent the length and width, respectively of a transistor, or capacitor gate. For example pMOS 324 (3.12/0.44), represents pMOS transistor element 324 of FIG. 3, with a gate length of 3.12 microngs (micron=μm) and a width of 0.44 microns.

Operating at 400 Mhz and with operating voltages of Vdd=1.8 volts and Vss=ground. the following transistor sizes follow as an example of one embodiment of a stable delay clock buffer, utilizing CMOS inverters for driver 314 and load 310: For driver 314, pMOS 324 (3.12/0.44) and nMOS 326 (1.24/0.4); For impedance element 330, pMOS 368 (4.96/0.4) and nMOS 364 (1.76/0.4); For capacitive load 340, pMOS capacitor 390 (20/3) and nMOS capacitor 380 (20/3); And for load 310, pMOS 309 (11.92/0.48) and nMOS 308 (4.24/0.48).

Figure 10:
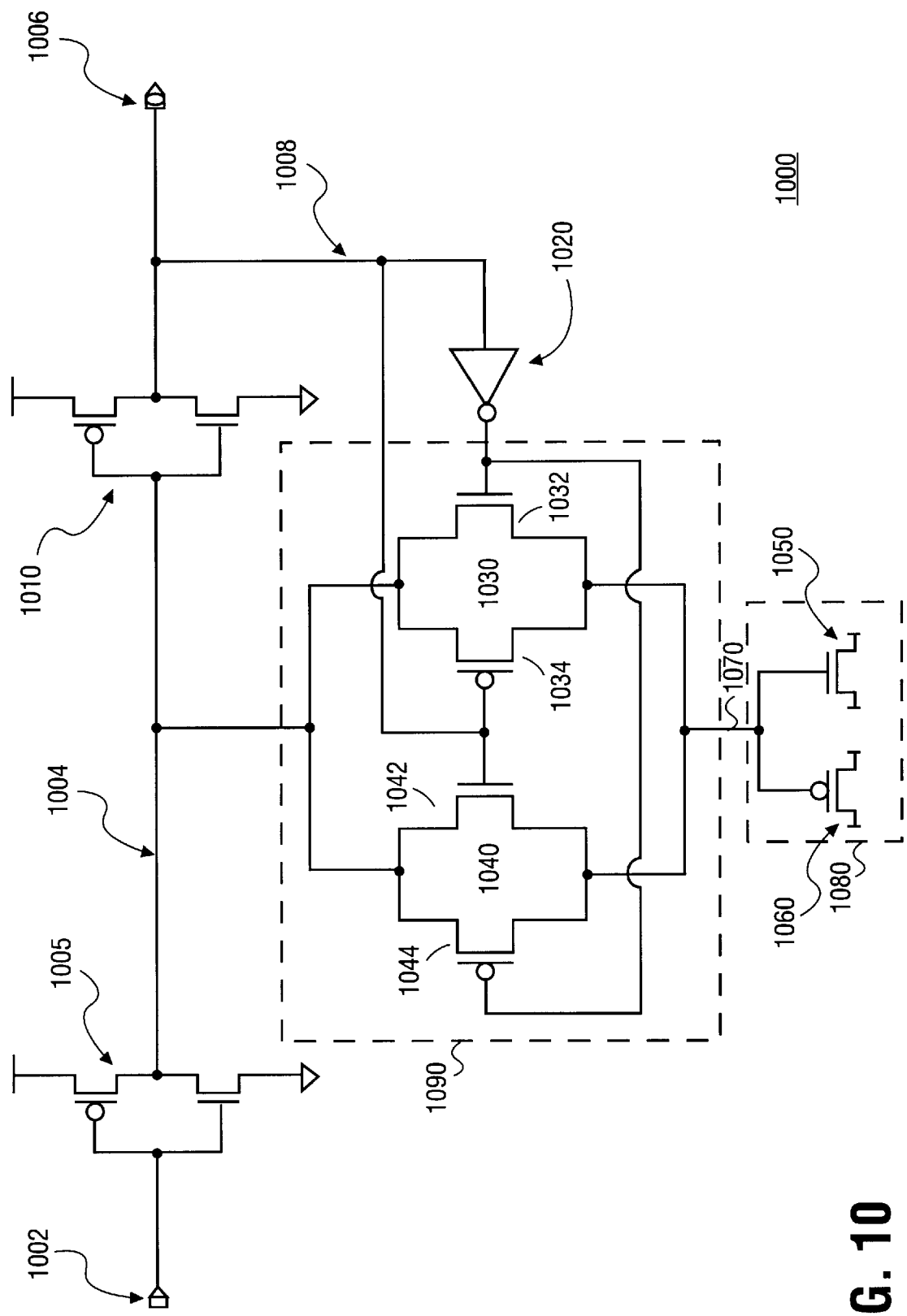
FIG. 10 illustrates an embodiment of a stable delay buffer circuit utilizing a dual passgate configuration as an impedance source.

FIG. 10 illustrates an alternative embodiment of the Stable delay buffer of the present invention. The embodiment 1000 of the Stable Delay Buffer shown in FIG. 10 includes, like the circuit of FIG. 3, a driver 1005, a load 1010, and a capacative load 1080 coupled to node 1004 between driver 1005 and load 1010 by a passgate block or impedance source 1090. In the embodiment of FIG. 10, two passgates 1040 and 1030 are used to connect the driven signal on node 1004 to the nMOS and pMOS capacitors 1050 and 1060 respectively. Passgate 1040 includes an nMOS transistor 1042 having one source/drain region coupled to node 1004 and the other source/drain region coupled to capacative node 1070 and its gate coupled to the output node 1006. Passgate 1030 also includes a pMOS transistor 1040 having one source/drain region coupled to node 1004 and the other source/drain region coupled to capacative node 1070 and its gate coupled to the output of inverter 1020. The input of inverter 1020 is coupled to the output node 1006. Passgate 1030 includes an nMOS transistor 1032 having one source/drain region coupled to node 1004 and the other source/drain region coupled to capacative node 1070 and its gate coupled to the output on inverter 1020. Passgate 1030 also includes a pMOS transistor 1034 having one source/drain region coupled to the node 1004 and the other source/drain region coupled to capacative node 1070 and its gate coupled to output node 1006.

In this configuration, the passgate that serves as the impedance source is set to be 1030 or 1040, depending on the input signal transition direction. For the specific circuit of FIG. 10, passgate 1030 will serve as impedance source when the buffer will experience up transition in its input node 1002. Complementary, passgate 1040 will serve as impedance source for sown transition at the input node 1002.

For example, before node 1002 will undergo up transition, it will be at "0" logic state, as will be the output node 1006. In this state passgate 1030 will be active whereas passgate 1040 will be inactive. During the transition, node 1002 will switch to "1" level (up transition) and node 1004 will switch from "1" to "0" level. During most of the transition, and especially in its beginning, passgate 1030 will be active and will serve as the impedance source which auto-corrects for the driver 1005 slew rates at node 1004. In the end of the buffer toggle, node 1006 will be at "1" level—disabling passgate 1030 and setting passgate 1040 active for the next transition (which will be down transition).

Since only one passgate serves as the impedance source for each transition, the auto-correct effects act in the same way as those of the previous configuration, shown in FIG. 3. The use of different impedance source for different signal transitions allows larger design treatment for each transition. For the specific circuit of FIG. 10, passgate 1030 sizing will affect only the input node up transition whereas passgate 1040 sizing will affect only the input node down transition. The increased design flexibility enables the circuit of FIG. 10 to achieve higher performance, thus making it improved over other configurations. It is also apparent that additional CMOS passgates and MOS capacitors could be added as required.

Figure 2:
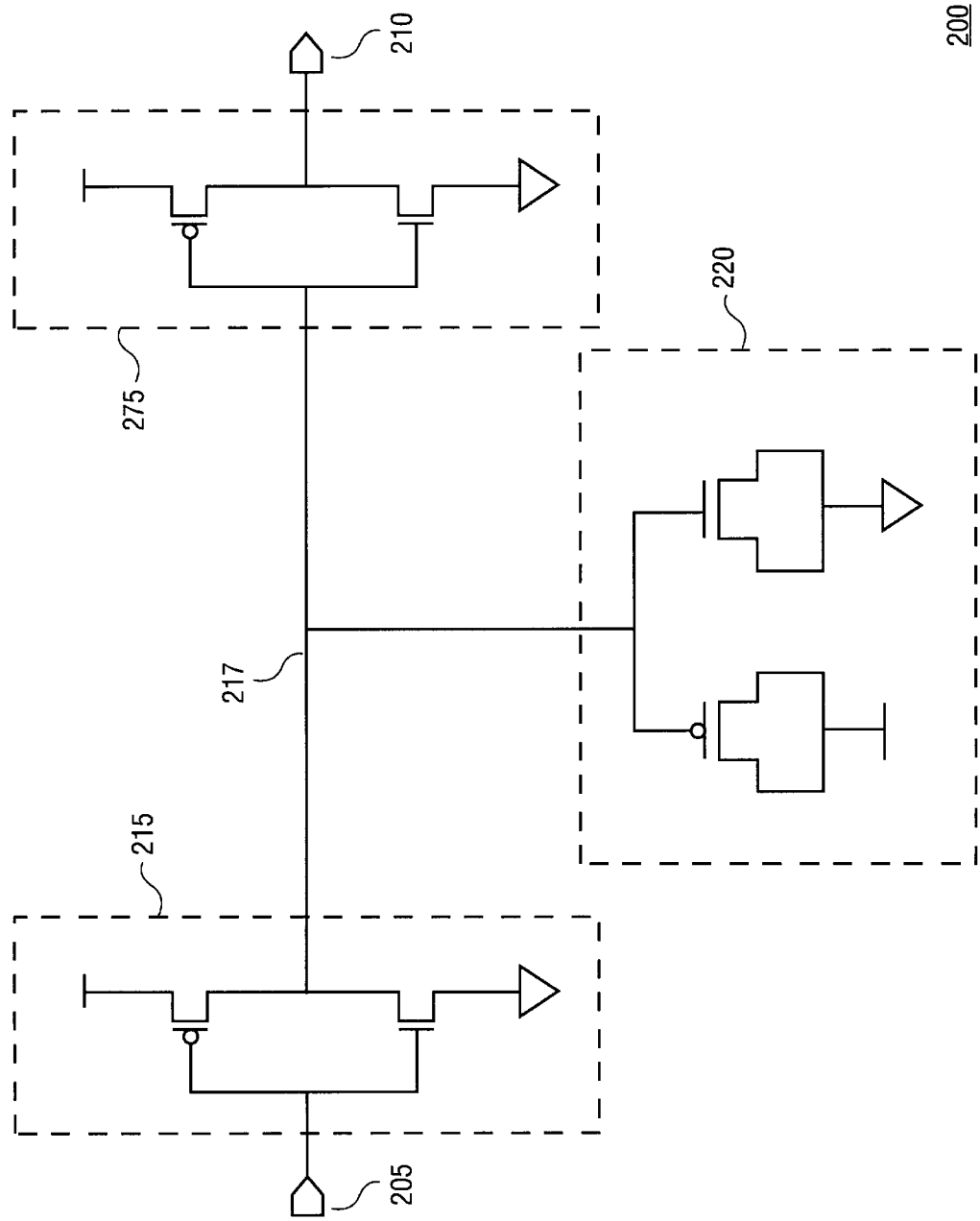
FIG. 2 shows a configuration for a timing delay buffer made up of two inverters in series with a capacitive load connected between the inverters.

An advantage of the Stable Delay Buffers of FIGS. 3 and 10 is that they are less sensitive to supply voltage and thus have a smaller delay window. The concept of delay window is most important for signal paths which have tight restrictive constraints over their timing characteristics. For example, a logic path whose delay should be greater then 2 nS and lower then 7.8 nS. This two extreme delay points form the delay window, which the signal delay should fit in through all PVT possible situation. If the pure logic part of the path has minimal delay of 1.5 nS we should add delay to the path, moving the path delay inside the desired delay window. If we will choose delay element with minimal delay of 0.6 nS (notice that 0.1 nS was taken as security margin from the specified window edge)—we will ensure that the path delay is greater then 2 nS but will have to check if it satisfies the maximal delay limit. Assuming simple logic has maximal to minimal delay ratio of 4, using simple logic (like in FIG. 1) to construct the delay element will cause maximal delay of 8.4 nS (1.5*4+0.6*4), thus bringing the path delay window outside the specified delay window. Using delay buffer with better maximal to minimal delay ratio of 3 (like the one in FIG. 2) will allow exact fitting of the path window without proper margins, which is very risky. Stable Delay Buffers like the ones of FIGS. 3 or 10, have better delay ratio (1.5 for example), due to its lower delay sensitivity to PVT variation and thus will create delay window of 2.1 nS (1.5+0.6) to 6.9 nS (1.5*4+0.6*1.5), which fit in the specified delay window with proper margins ensuring safe and robust design.

What is claimed is:

1. A circuit comprising:

a driver circuit configured to output a signal;

a load circuit coupled to the output of the driver circuit; and an active load circuit coupled to an output of the driver circuit, the active load circuit configured to actively adjust the slew rate of the signal wherein the active load circuit comprises:

a capacitive load circuit; and a variable impedance circuit coupled between the driver circuit and the capacitive load circuit, the variable impedance circuit configured to adjust the slew rate in response to changes in fabrication process and operating conditions wherein the variable impedance circuit comprises:

a first and a second nMOS transistor coupled between the output of the driver circuit and the capacitive load circuit;

a first and a second pMOS transistor coupled between the output of the driver circuit and the capacitive load circuit, wherein a gate of the first nMOS transistor and a gate of the first pMOS transistor are coupled to an output of the load circuit; and an inverter having an input coupled to the output of the first load circuit, and an output coupled to a gate of the second nMOS transistor and to a gate of the second pMOS transistor.

2. The circuit of claim 1 wherein the capacitive load circuit comprises:

a nMOS capacitor coupled between a second voltage source and the variable impedance circuit; and a pMOS capacitor coupled between a first voltage source and the variable impedance circuit.

3. The circuit of claim 1 further comprising a first load circuit coupled to the output of the driver circuit.

4. The circuit of claim 1 wherein the driver circuit is a complementary metal oxide semiconductor (CMOS) driver circuit.

5. The circuit of claim 3 wherein the first load circuit is a CMOS load circuit.

6. The circuit of claim 3 wherein the driver circuit is a CMOS drive circuit and the first load circuit is a CMOS load circuit.

7. A circuit comprising:

a driver circuit configured to output a signal;

a first load circuit coupled to an output of the driver circuit; and an active load circuit coupled the output of the driver circuit and an output from the first load circuit, the active load circuit being configured to actively adjust the slew rate of the signal in response to an output signal from the first load circuit wherein the active load circuit comprises:

a capacitive load circuit; and a variable impedance circuit coupled between the driver circuit and the capacitive load circuit, the variable impedance circuit configured to adjust the slew rate in response to changes in fabrication process and operating conditions wherein the variable impedance circuit comprises:

a first and a second nMOS transistor coupled between the output of the driver circuit and the capacitive load circuit;

a first and a second pMOS transistor coupled between the output of the driver circuit and the capacitive load circuit, wherein a gate of the first nMOS transistor and a gate of the first pMOS transistor are coupled to an output of the first load circuit; and an inverter with an input coupled to the output of the first load circuit, wherein an inverted output of the inverter is coupled to a gate of the second nMOS transistor and to a gate of the second pMOS transistor.

8. The circuit of claim 7 wherein the capacitive load circuit comprises:

a nMOS capacitor coupled between a second power connection and the variable impedance circuit; and a pMOS capacitor coupled between a first power connection and the variable impedance circuit.

9. The circuit of claim 7 wherein the driver circuit is a complementary metal oxide semiconductor (CMOS) driver circuit.

10. The circuit of claim 7 wherein the first load circuit is a CMOS load circuit.

11. The circuit of claim 7 wherein the driver circuit is a CMOS drive circuit and the first load circuit is a CMOS load circuit.

* * * * *

UNITED STATES PATENT AND TRADEMARK OFFICE
CERTIFICATE OF CORRECTION

PATENT NO.     : 6,150,862
DATED          : November 21, 2000
INVENTOR(S)    : Vikinski It is certified that error appears in the above-identified patent and that said Letters Patent is hereby corrected as shown below:

Column 10,
Line 66, delete "first".

Column 11,
Line 2, delete "first".

Signed and Sealed this

Fifteenth Day of October, 2002

Attest:

JAMES E. ROGAN
Attesting Officer         Director of the United States Patent and Trademark Office